United States Patent [19]

Koops

[11] 4,021,674

[45] May 3, 1977

[54] CHARGED-PARTICLE BEAM OPTICAL APPARATUS FOR IRRADIATING A SPECIMEN IN A TWO-DIMENSIONAL PATTERN

[75] Inventor: Hans Koops, Nieder-Ramstadt, Germany

[73] Assignee: Siemens Aktiengesellschaft, Munich, Germany

[22] Filed: Sept. 26, 1975

[21] Appl. No.: 617,062

[30] Foreign Application Priority Data

Sept. 27, 1974 Germany .......................... 2446789

[52] U.S. Cl. ............................ 250/492 A; 250/398
[51] Int. Cl.² ......................................... H01J 37/00
[58] Field of Search ........... 250/492 A, 492 B, 398, 250/505

[56] References Cited

UNITED STATES PATENTS

| | | | |
|---|---|---|---|
| 3,440,466 | 4/1969 | Colvin et al. | 250/492 A |
| 3,614,423 | 10/1971 | Heynick et al. | 250/492 A |
| 3,736,425 | 3/1973 | Chernow | 250/492 A |

Primary Examiner—Alfred E. Smith
Assistant Examiner—B. C. Anderson
Attorney, Agent, or Firm—Kenyon & Kenyon Reilly Carr & Chapin

[57] ABSTRACT

An improved charged-particle beam optical apparatus for the irradiation of a specimen in a two-dimensional pattern having first areas which are unexposed to the particle beam and are surrounded at least almost entirely by second areas which are exposed to the beam. The improvement of the invention comprises a mask disposed in the path of the beam which is uniformly irradiated by the beam and has apertures disposed therein in an arrangement corresponding to the two-dimensional pattern. A support grid comprising a plurality of spaced-apart, parallel strip members is disposed beneath the mask and at least in engagement with the portions thereof which correspond to the unexposed areas of the two-dimensional pattern. Deflection means laterally deflect the image of the mask and the strip members projected onto the specimen in a direction approximately perpendicular to the longitudinal axes of the strip members at least through a distance which is equal to the width of the strip members.

2 Claims, 3 Drawing Figures

CHARGED-PARTICLE BEAM OPTICAL APPARATUS FOR IRRADIATING A SPECIMEN IN A TWO-DIMENSIONAL PATTERN

BACKGROUND OF THE INVENTION

1. Field of the Invention

This invention relates generally to charged-particle beam apparatus, and in particular to an improved electron beam optical apparatus for irradiating a specimen in a two-dimensional pattern having first areas which are unexposed to the electron beam and are surrounded at least almost entirely by second areas which are exposed to the electron beam.

2. Description of the Prior Art

It is known in the art to generate two-dimensional patterns of the above-described type by means of a scanning electron microscope. In such an apparatus, the electron beam of the microscope is focused on a specimen and guided thereover in raster fashion. Light and dark modulation of the electron beam is accomplished in one known apparatus by means of a "flying spot scanner." Such a scanner comprises a cathode-ray tube fluorescent screen which is scanned uniformly by the electron beam. A light spot results and illuminates a mask having a pattern corresponding to a two-dimensional pattern which is to be generated. The light passed by the mask serves as an unblanking signal for the scanning microscope which is synchronized with the cathode-ray tube. Further details of this apparatus are described in 44 Rev. Sci. Instr. 1282–1285 (1973).

In another known apparatus, the electron beam of the microscope is unblanked by means of a digital computer. In this device, the electron beam is sequentially guided in raster fashion across the areas to be exposed. Further details of this apparatus are described in 10 J. Vac. Sci. Technol. 1052–1055 (1973).

The two aforementioned unblanking apparatus have the disadvantage that they are considerably complex in construction. The time required to form a two-dimensional pattern, however, depends upon the shape and size thereof, and is at least equal to the product of the total number of raster dots to be exposed to the electron beam of the apparatus and the required exposure time of each dot. (A raster "dot", as used herein, refers to a screen area which is equal to the cross-sectional area of the electron beam at the specimen examined).

SUMMARY OF THE INVENTION

It is therefore an object of the present invention to provide an improved charged-particle beam optical apparatus for the irradiation of a specimen in a two-dimensional pattern which overcomes the aforementioned disadvantages of heretofore known apparatus and achieves the irradiation of a specimen both simply and quickly.

These and other objects are achieved in a charged-particle beam optical apparatus for the irradiation of a specimen in a two-dimensional pattern having first areas which are unexposed to the beam and are surrounded at least almost entirely by second areas which are exposed to the particle beam. The improvement of the invention comprises the provision of a mask disposed in the path of the electron beam which is uniformly irradiated by the beam and has apertures disposed therein in an arrangement corresponding to the two-dimensional pattern to be projected. The apertures pass electrons of the beam through the mask in the aperture pattern and image the mask on the specimen. A support grid comprising a plurality of spaced-apart, parallel strip members is disposed beneath the mask and at least in engagement with the portions thereof which correspond to the unexposed areas of the pattern. Deflection means laterally deflect the image of the mask and strip members projected onto the specimen in a direction approximately perpendicular to the longitudinal axes of the strip members and at least through a distance which is equal to the width of the strip members. The deflection means may comprise electrostatic deflection plates disposed between the mask and the specimen adjacent to the beam path in combination with sawtooth wave generating means coupled to the plates for deflecting the beam and the image of the mask.

The advantage of the inventive apparatus is that in imaging the mask on the specimen by electron beam optics and deflecting the image during exposure of the specimen to the beam in the manner described, the interruption of contiguous lines and/or areas to be exposed caused by the support grid disposed beneath the mask is eliminated. Moreover, the total time that the specimen is exposed to the electron beam is substantially reduced compared to exposure times in heretofore known apparatus. This is so, since the irradiation pattern is not generated point by point, but rather is generated in its entirety except for the aforementioned interruptions of contiguous lines and areas (during a single exposure of the specimen to the electron beam).

The deflection of the mask image which eliminates the interruptions described above can be achieved by moving the mask mechanically by a suitable apparatus. Alternatively, the image may be displaced electrically or magnetically by means of a deflection system, in which case electrical field plates or magnetic deflection coils are utilized to deflect the path of the electron beam. The beam of the apparatus may be deflected through the specified distance one or more times; where the beam is deflected a plurality of times, the deflection is preferably in sawtooth or sinusoidal fashion.

36 Optic 93–110 (1972) describes the generation of a line grid which has alternately exposed and unexposed strips by projecting a cross grid comprising a plurality of electron-impermeable horizontal and vertical strips on a specimen by electron optical methods and deflecting the grid in the direction of the horizontal strips by a distance equal to the width of the vertical strips of the grid. A two-dimensional pattern with isolated unexposed areas is, however, not obtainable by such a method.

These and other novel features of the inventive apparatus will be described in further detail in the following detailed description.

BRIEF DESCRIPTION OF THE DRAWINGS

Referring now to the drawings, wherein similar reference numerals denote similar elements throughout the several views thereof.

DETAILED DESCRIPTION

Figure 1:
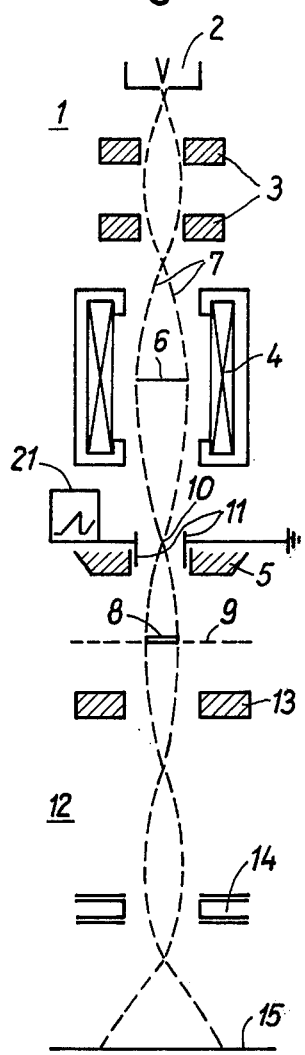
FIG. 1 is a schematic diagram of an improved charged-particle beam optical apparatus, specifically an electron-optical reducing device for imaging the electron-optical image of a mask on a specimen, constructed according to the invention.

Referring now to the drawings, there is shown in FIG. 1 a charged-particle beam optical apparatus for the irradiation of a specimen in a two-dimensional pattern having first areas which are unexposed to the electron beam of the apparatus and are surrounded at least almost entirely by second areas which are exposed to the electron beam. More specifically, there is shown an electron-optical reducing device 1 which is particularly useful for manufacturing microcircuits. The reducing device 1 comprises a source of electrons 2, condensor 3 disposed subsequent to the source of electrons along the beam path, a magnetic field lens 4 disposed subsequent and adjacent to the condensor, and a reducing lens 5 disposed subsequent to the magnetic field lens. A beam mask 6, disposed within and at the center of field lens 4, is uniformly irradiated by electron beam, as illustrated by beam path 7, and the electron-optical image of mask 6 is projected into the recording plane 9 of device 1. Electrostatic deflection plates 11 are disposed between field lens 4 and reducing lens 5 at the point of entrance pupil 10 of the reducing lens. The plates deflect the electron beam and, thus, the reduced electron-optical image of mask 6 projected into recording plane 9. An electron microscope 12 is disposed subsequent to reducing device 1 along the beam path to permit the electron-optical image of the mask in plane 9 to be checked and focused. Microscope 12 comprises an objective lens 13, a projection lens 14 disposed subsequent thereto along the beam path, and a fluorescent screen 15 disposed subsequent to projection lens 14 on which the projected image is displayed.

A specimen 8 is disposed in plane 9 of device 1 and is coated with an electron-sensitive layer of material, such as, for example, photoresist. Mask 6 is provided with a plurality of apertures 17 disposed in the arrangement illustrated in FIG. 2 for illuminating specimen 8 in the form of a two-dimensional pattern which has unexposed areas surrounded at least almost completely by exposed areas. The surface 16 of mask 6 is impermeable to electrons, except for openings 17 through which electrons of the beam pass. Those electrons passing through the mask impinge on the surface of specimen 8 and expose it in the pattern of the arrangement of apertures 17. A support grid comprising a plurality of spaced-apart parallel strip members 18 of equal width which are also impermeable to electrons of the beam is disposed beneath mask 6 and at least in engagement with the portions of the mask which correspond to the first unexposed areas of the projected pattern. In other words, strip members 18 support at least the areas of mask 6 which are completely surrounded by apertures 17. One of those areas is designated by the numeral 19 in FIG. 2.

Figure 3:
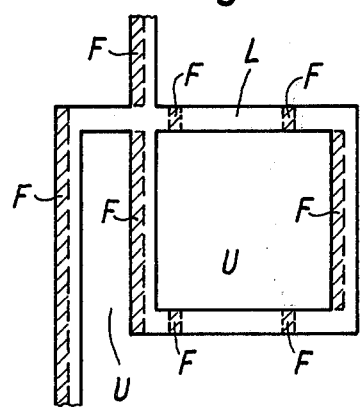
FIG. 3 is a plan view of a two-dimensional pattern projected by the mask illustrated in FIG. 2.

During the exposure of specimen 8 to the electron beam of the apparatus, deflection plates 11 are temporarily excited in known manner to produce a perpendicular deflection with respect to strip members 18 of the support grid (indicated by arrow 20 in the drawings) of the electron-optical image of the mask and support grid through a distance which is equal to the width B of the strip members. In the illustrated embodiment of the invention, deflection plates 11 are coupled to a sawtooth wave generator 21 which provides the required excitation signal. As a result of the described deflection of the electron beam, the irradiation pattern illustrated in FIG. 3 is obtained on specimen 8. This irradiation pattern has exposed areas which are enclosed and which surround unexposed areas U. The exposed areas of the pattern comprise the portions designated F and L. Portions L are irradiated on the specimen directly, whereas portions F are exposed through deflection of the electron beam. After an appropriate treatment, such as, for example, dissolving the electron-sensitive layer of material on the specimen at the exposed areas thereof, additional areas whose function differs from that of surrounding areas can be produced on the specimen. It is thus possible, for example, to dope the free areas of the specimen with metal ions so that these areas can also be utilized as either insulating areas or conductors. It should be further noted that conductors can be formed directly by electron irradiation. In the latter situation, the specimen must be coated with a layer of material containing a metal compound that is reducible by electron irradiation.

Figure 2:
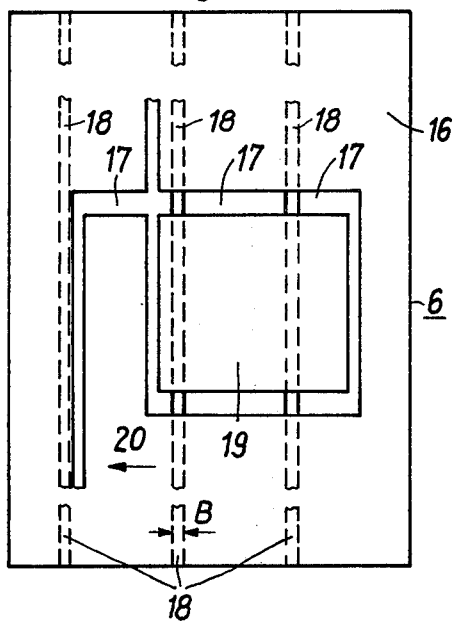
FIG. 2 is a top plan view of the mask of the apparatus.

As can be seen from FIGS. 2 and 3, deflection of the electron-optical image of mask 6 produces a widening of the exposed areas of the pattern parallel to the direction of the support grid. If this widening effect is not desired, the width of apertures 17 corresponding to these areas may be reduced, as shown in FIG. 2, by a distance which is equal to the width of the strip members 18 of the support grid. In addition, another support grid may be provided for the mask in a direction perpendicular to the support grid formed by strip members 18. Further mechanical stability of the areas of mask 6 which correspond to the unexposed areas of the pattern can thereby be achieved. If a second support grid is utilized, however, the electron-optical image of the mask must be deflected perpendicular to the direction of the strip members forming the second support grid by an amount which is at least equal to the width of the strip members of the latter grid.

The improved apparatus of the invention has its primary application in electron-optical reducing devices. It may, however, also be utilized in an electron radiation apparatus for projecting the image of the mesk on a specimen in the ratio of 1:1. In addition, the inventive apparatus may be utilized in an ion-optical irradiation device.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a charge-particle beam optical apparatus for the irradiation of a specimen in a two-dimensional pattern, said pattern having first areas which are unexposed to said beam and are surrounded at least almost entirely by second areas which are exposed to said beam, the improvement comprising:
    a beam mask disposed in the path of said charged-particle beam, said mask being uniformly irradiated by said beam and having apertures disposed therein in an arrangement corresponding to said pattern for passing particles of said beam through said mask and imaging said mask on said specimen;

a support grid, comprising a plurality of spaced-apart parallel strip members, disposed beneath said mask and at least in engagement with the portions thereof which correspond to said first unexposed areas of said pattern; and means for laterally deflecting said beam and the image of said mask and said strip members projected onto said specimen in a direction approximately perpendicular to the longitudinal axes of said strip members at least through a distance which is equal to the width of said strip members.

2. In the charged-particle beam optical apparatus recited in claim 1, wherein said means for deflecting comprises electrostatic deflection plates disposed between said mask and said specimen adjacent to said particle beam path, and sawtooth wave generating means coupled to said plates for deflecting said beam and said image of said mask.

* * * * *